(12) United States Patent
Fujiwara et al.

(10) Patent No.: US 9,136,232 B2
(45) Date of Patent: Sep. 15, 2015

(54) METHOD FOR BONDING WAFERS AND STRUCTURE OF BONDING PART

(71) Applicant: OMRON Corporation, Kyoto-shi, Kyoto (JP)

(72) Inventors: Takeshi Fujiwara, Nara (JP); Toshiaki Okuno, Shiga (JP); Katsuyuki Inoue, Kyoto (JP); Junya Yamamoto, Shiga (JP); Kenichi Hinuma, Kyoto (JP); Yoshiki Ashihara, Kyoto (JP); Takaaki Miyaji, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/344,274

(22) PCT Filed: Sep. 27, 2012

(86) PCT No.: PCT/JP2012/074955
§ 371 (c)(1),
(2) Date: Mar. 11, 2014

(87) PCT Pub. No.: WO2013/051463
PCT Pub. Date: Apr. 11, 2013

(65) Prior Publication Data
US 2014/0339710 A1 Nov. 20, 2014

(30) Foreign Application Priority Data
Oct. 6, 2011 (JP) .................................. 2011-222284

(51) Int. Cl.
*H01L 23/00* (2006.01)
*H01L 23/02* (2006.01)
(Continued)

(52) U.S. Cl.
CPC ............ *H01L 24/05* (2013.01); *B81C 1/00269* (2013.01); *H01L 21/50* (2013.01); *H01L 23/02* (2013.01); *H01L 23/10* (2013.01); *H01L 24/03* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 25/065* (2013.01); *H01L 25/07* (2013.01); *H01L 25/18* (2013.01);
(Continued)

(58) Field of Classification Search
CPC combination set(s) only.
See application file for complete search history.

(56) References Cited

U.S. PATENT DOCUMENTS

2007/0249163 A1   10/2007 Oikawa
2011/0221056 A1*  9/2011  Miyaji et al. ................. 257/698
2012/0256187 A1*  10/2012 Yu et al. .......................... 257/76

FOREIGN PATENT DOCUMENTS

| JP | 3303227 B2    | 7/2002  |
| JP | 2007-311771 A | 11/2007 |
| JP | 2011-192847 A | 9/2011  |

OTHER PUBLICATIONS

International Search Report issued in PCT/JP2012/074955 mailed on Oct. 30, 2012 (4 pages).

*Primary Examiner* — Roy Potter
(74) *Attorney, Agent, or Firm* — Osha Liang LLP (57) ABSTRACT

A method for bonding wafers includes forming a first bonding part on a surface of a first wafer by stacking a diffusion preventing layer formed of a material having low wettability with AuSn above the first wafer and forming a bonding layer on a surface of the diffusion preventing layer such that the bonding layer stays back of an edge of the diffusion preventing layer, forming a second bonding part on a surface of a second wafer, and bonding the first bonding part and the second bonding part by eutectic bonding with an AuSn solder under a condition that the first wafer and the second wafer are opposed to each other.

13 Claims, 7 Drawing Sheets

(51) Int. Cl.
  *H01L 25/065* (2006.01)
  *H01L 25/07* (2006.01)
  *H01L 25/18* (2006.01)
  *H01L 23/10* (2006.01)
  *H01L 21/50* (2006.01)
  *B81C 1/00* (2006.01)

(52) U.S. Cl.
  CPC . *B81C2203/019* (2013.01); *H01L 2224/02372* (2013.01); *H01L 2224/0401* (2013.01); *H01L 2224/05083* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05184* (2013.01); *H01L 2224/05548* (2013.01); *H01L 2224/06182* (2013.01); *H01L 2224/13007* (2013.01); *H01L 2224/1308* (2013.01); *H01L 2224/13022* (2013.01); *H01L 2224/13111* (2013.01); *H01L 2224/13144* (2013.01); *H01L 2224/13164* (2013.01); *H01L 2224/13169* (2013.01); *H01L 2224/13173* (2013.01); *H01L 2224/13176* (2013.01); *H01L 2224/13178* (2013.01); *H01L 2224/14181* (2013.01); *H01L 2224/1601* (2013.01); *H01L 2224/16058* (2013.01); *H01L 2224/16502* (2013.01); *H01L 2224/16506* (2013.01); *H01L 2224/2908* (2013.01); *H01L 2224/29171* (2013.01); *H01L 2224/3201* (2013.01); *H01L 2224/32058* (2013.01); *H01L 2224/32502* (2013.01); *H01L 2224/32506* (2013.01); *H01L 2224/81193* (2013.01); *H01L 2224/81805* (2013.01); *H01L 2224/83193* (2013.01); *H01L 2224/83805* (2013.01); *H01L 2224/94* (2013.01); *H01L 2924/01322* (2013.01); *H01L 2924/1461* (2013.01)

METHOD FOR BONDING WAFERS AND STRUCTURE OF BONDING PART

BACKGROUND

1. Technical Field

The present invention relates to a method for bonding wafers and a structure of a bonding part, and more particularly, to a method for bonding two wafers by AuSn eutectic bonding and a structure of its bonding part.

2. Related Art

When bonding parts of two wafers are bonded, AuSn eutectic bonding is used in some cases. The AuSn eutectic bonding means a bonding method using an eutectic reaction of a metal and AuSn and is used in fields of advanced MEMS packaging and three-dimensional stacking technique. According to the AuSn eutectic bonding, the AuSn is melted like a solder, and it has an advantage that bonding can be easily performed even when a surface of the bonding part is rough like a plated layer.

Thus, when the bonding parts of the wafers are bonded by the AuSn eutectic bonding, as for one wafer, an adhesive layer formed of Cr is provided in some cases as a layer (lowermost layer) which is in contact with the wafer (refer to patent document 1). This adhesive layer functions to enhance adhesiveness between the bonding part and the wafer.

However, when the molten AuSn solder comes in contact with the adhesive layer and the AuSn diffuses into the adhesive layer when the bonding parts are bonded, adhesive force between the adhesive layer and the wafer deteriorates, and reliability reduces in the bonding part.

In addition, as for the other wafer, a penetration wiring which penetrates the wafer is connected in some cases to the bonding part (electrode) provided on a surface of the wafer (refer to patent document 2). In this case, the bonding part is previously provided on the surface of the wafer, a via hole is formed in the wafer so as to penetrate it, the penetration wiring is formed in the via hole by a plating method, and the penetration wiring is bonded to the bonding part. However, the bonding part is formed of the same material (such as Al) as the penetration wiring in the via hole in general, so that when the via hole is formed by etching the wafer, or when the penetration wiring is formed by plating, the bonding part could be etched and damaged by an etching solution or a plating solution (acid liquid in general).

[Patent Document 1]: Japanese Patent No. 3303227
[Patent Document 2]: Japanese Unexamined Patent Publication No. 2007-311771

SUMMARY

According to one or more embodiments of the present invention, a method for bonding wafers and a structure of a bonding part is capable of preventing the bonding part from deteriorating due to AuSn. According to one or more embodiments of the present invention, a structure of a bonding part is capable of preventing the bonding part from being damaged when a penetration wiring is formed in a via hole.

A method for bonding wafers according to one or more embodiments of the present invention includes steps of forming a first bonding part on a surface of a first wafer by stacking a diffusion preventing layer formed of a material having low wettability with AuSn above the first wafer and forming a bonding layer on a surface of the diffusion preventing layer in such a manner that the bonding layer stays back of an edge of the diffusion preventing layer, forming a second bonding part on a surface of a second wafer, and bonding the first bonding part and the second bonding part by eutectic bonding with an AuSn solder under a condition that the first wafer and the second wafer are opposed to each other.

According to the method for bonding the wafers in one or more embodiments of the present invention, the bonding layer is provided on the surface of the diffusion preventing layer formed of the material having low wettability with AuSn in such a manner that it stays back of the edge of the diffusion preventing layer, so that the molten AuSn solder is not likely to spread on the surface of the diffusion preventing layer when the first bonding part is bonded by the AuSn eutectic bonding, and the AuSn solder is prevented from flowing toward the first wafer. Therefore, even when a layer which is likely to deteriorate due to the diffusion of the AuSn is provided between the first wafer and the diffusion preventing layer, the layer is not likely to deteriorate because the AuSn does not diffuse thereto. There is a case where the adhesive layer containing Cr as its main component is formed on the surface of the first wafer. This is because Cr is high in adhesiveness with the wafer, so that the first bonding part can be firmly adhered to the first wafer. In this case, when the AuSn diffuses into the adhesive layer, the adhesiveness of the adhesive layer deteriorates, but according to one or more embodiments of the present invention, the AuSn can be prevented from diffusing into the adhesive layer, so that the adhesive layer can be prevented from peeling off. In addition, in a case where an actuator is formed under the first bonding part, the AuSn solder can be prevented from going beyond the diffusion preventing layer and attaching to the actuator.

According to the method for bonding the wafers in one or more embodiments of the present invention, an AuSn solder layer is previously formed on at least one surface of the first bonding part and the second bonding part by alternately stacking Au and Sn or with an AuSn alloy, and the first bonding part and the second bonding part are bonded by the AuSn eutectic bonding with the molten AuSn solder layer. Thus, since the AuSn solder layer is previously provided, it is not necessary to apply the AuSn solder to either bonding part when the first bonding part and the second bonding part are bonded.

According to one or more embodiments of the present invention, the diffusion preventing layer of the first bonding part is formed of a material containing, as its main component, a platinum group metal such as Pt, Rh, Pd, Ir, Ru, or Os. Since the material containing the platinum group metal as its main component is low in wettability with AuSn, the molten AuSn solder is not likely to spread on the surface of the diffusion preventing layer. In addition, the material containing the platinum group metal as its main component can prevent the AuSn from passing through the diffusion preventing layer and diffusing to the lower layer of the diffusion preventing layer.

According to one or more embodiments of the present invention, the bonding layer of the first bonding part is formed of a material containing Au as its main component. This is because it is compatible with AuSn.

In addition, an Au layer may be provided between the adhesive layer and the diffusion preventing layer. The diffusion preventing layer is strong in stress and could peel off, but by forming the Au layer between the adhesive layer and the diffusion preventing layer, the diffusion preventing layer can be reduced in stress and prevented from peeling off.

In addition, according to a method for bonding the wafers in one or more embodiments of the present invention, in the step of forming the first bonding part on the surface of the first wafer, an opening/closing contact point is formed by stacking layers formed of the same materials in the same order as those of the first bonding part, on the surface of the first wafer. According to one or more embodiments of the present invention, each layer of the opening/closing contact point is provided to be the same in thickness and to be the same in height from the surface of the first wafer as the corresponding layer in the first bonding part. Accordingly, the opening/closing contact point can be produced at the same time as the step of forming the first bonding part, so that manufacturing cost can be reduced.

According to a method for bonding the wafers according to one or more embodiments of the present invention, a face having contact with the second wafer in the second bonding part is composed of a conductive layer formed of a material having high chemical resistance (such as one or more materials selected from Ti, Tin, W, or platinum group material), a via hole is formed in the second wafer in a position corresponding to the second bonding part, and a penetration wiring is formed in the via hole to be connected to the conductive layer formed of the material having the high chemical resistance. There is a case where a semiconductor integrated circuit or an actuator is provided on the second wafer and connected to the second bonding part of the second wafer, or the actuator or the semiconductor integrated circuit is provided on the first wafer and connected to the second bonding part through the first bonding part in some cases. In this case, the second bonding part is connected to a bump provided on an outer face of the second wafer through the penetration wiring formed in the via hole provided in the second wafer in some cases. Even in this case, since the face which is in contact with the second wafer in the second bonding part is composed of the conductive layer formed of the material having high chemical resistance, the second bonding part is not likely to be damaged by an etching solution used at the time of opening the via hole in the second wafer, or a plating solution used at the time of forming the penetration wiring.

In addition, by providing the conductive layer formed of one or more materials selected from Al, Cu, Ni, W, or polysilicon and having a relatively large thickness in the second bonding part, a larger space can be formed between the first wafer and the second wafer.

In addition, by forming an Au layer on a surface of the second bonding part, and covering an outer periphery face and an outer periphery edge of the surface of the second bonding part with an insulating coating film, an exposed area of the surface of the second bonding part is reduced, so that the AuSn is not likely to spread on the surface of the second bonding part when the second bonding part is connected by the AuSn eutectic bonding.

According to a structure of a first bonding part in one or more embodiments of the present invention, a diffusion preventing layer formed of a material having low wettability with AuSn is stacked above a wafer, a bonding layer is formed on a surface of the diffusion preventing layer in such a manner that the bonding layer stays back of an edge of the diffusion preventing layer, and a functional layer easily deteriorating due to diffusion of the AuSn is formed between the wafer and the diffusion preventing layer. According to the structure of the bonding part, since the bonding layer provided on the surface of the diffusion preventing layer formed of the material having the low wettability with the AuSn is formed so as to stay back of the edge of the diffusion preventing layer, a molten AuSn solder is not likely to spread on the surface of the diffusion preventing layer when the first bonding part is connected by AuSn eutectic bonding, and the AuSn solder is not likely to flow into the functional layer which easily deteriorates due to the diffusion of the AuSn. Therefore, the functional layer hardly deteriorates because the AuSn does not diffuse into the functional layer.

According to one or more embodiments of the present invention, the diffusion preventing layer of the first bonding part is formed of a material containing, as its main component, a platinum group metal such as Pt, Rh, Pd, Ir, Ru, or Os. Since the material containing the platinum group metal as its main component is low in wettability with the AuSn, the molten AuSn solder is not likely to spread on the surface of the diffusion preventing layer. In addition, the material containing the platinum group metal as its main component can prevent the AuSn passing through the diffusion preventing layer and diffusing to the lower layer of the diffusion preventing layer.

The functional layer of the first bonding part is an adhesive layer formed on a surface of the first wafer and containing Cr as its main component. Since the Cr is high in adhesiveness with the wafer, the first bonding part and the first wafer can be firmly adhered. When the AuSn diffuses into the adhesive layer, the adhesiveness of the adhesive layer deteriorates, but according to one or more embodiments of the present invention, the AuSn is prevented from diffusing into the adhesive layer.

According to one or more embodiments of the present invention, the bonding layer of the first bonding part is formed of a material containing Au as its main component. This is because it is compatible with the AuSn.

According to a structure of the bonding part according to one or more embodiments of the present invention, an opening/closing contact point is formed by stacking layers composed of the same materials in the same order as those of the first bonding part, on the surface of the first wafer. According to one or more embodiments of the present invention, each layer of the opening/closing contact point has the same thickness and the same height from the surface of the first wafer as those of the corresponding layer in the first bonding part. Accordingly, the opening/closing contact point can be produced at the same time as the first bonding part in the same step, so that the manufacturing cost can be low.

A structure of a second bonding part in one or more embodiments of the present invention has a first conductive layer formed of a material having high chemical resistance on a surface of a wafer, a second conductive layer formed on the first conductive layer and having a relatively large thickness, and a barrier layer formed on the second conductive layer. According to the structure of the bonding part, the surface which is in contact with the wafer is composed of the conducive layer formed of the material having the high chemical resistance, so that the bonding part is not damaged by the etching solution used at the time of opening the via hole in the wafer, or the plating solution used at the time of forming the penetration wiring.

In addition, by forming an electronic component structure body in the pair of wafers bonded by the method for bonding the wafers according to one or more embodiments of the present invention, an electronic component can be produced.

Embodiments formed by combining or modifying disclosed embodiments are within a scope of the present invention.

DETAILED DESCRIPTION

Hereinafter, embodiments of the present invention will be described with reference to the accompanying drawings. However, the present invention is not limited to the following embodiments, and can be variously designed without departing from the scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Structure of Bonding Part and Bonding Method

Figure 1A:
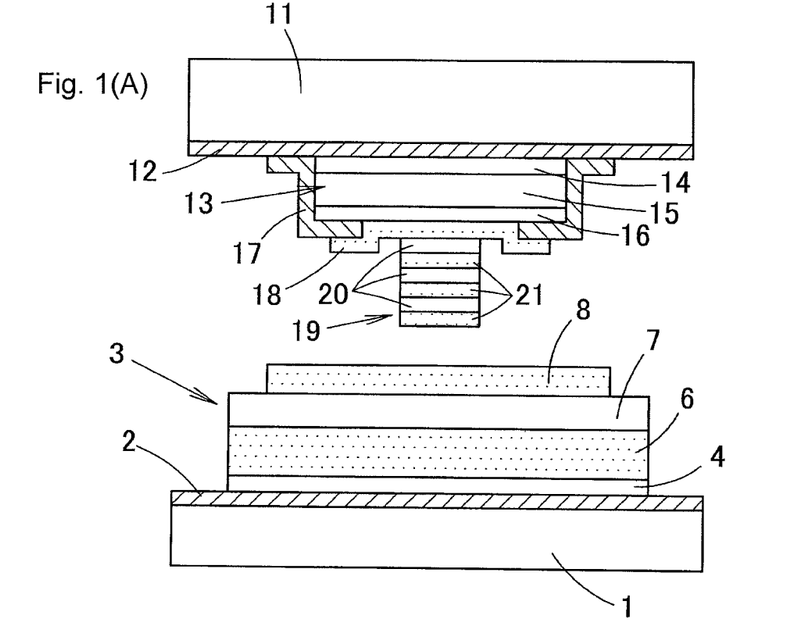
FIGS. 1A and 1B are schematic cross-sectional views to describe a method for bonding wafers according to one or more embodiments of the present invention.
Figure 1B:
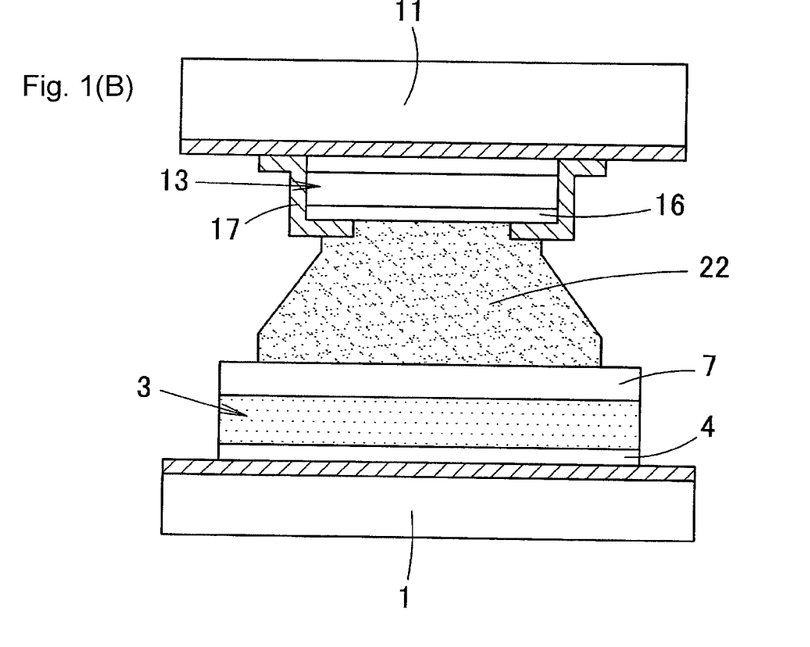

FIGS. 1A and 1B are schematic cross-sectional views to describe a method for bonding wafers according to one or more embodiments of the present invention. FIG. 1A shows a structure before a first wafer and a second wafer are bonded, and FIG. 1B shows a structure after the wafers have been bonded.

As shown in FIG. 1A, a first bonding part, that is, a bonding part 3 is provided on a surface of a first wafer, that is, a wafer 1. The wafer 1 is a Si wafer, and an insulating layer 2 of $SiO_2$ or SiN is formed on its surface. In addition, an adhesive layer 4 is formed on an upper face of the insulating layer 2, and an Au layer 6 is formed on an upper face of the adhesive layer 4. Furthermore, a diffusion preventing layer 7 and a bonding layer 8 are sequentially formed on the Au layer 6. Thus, the bonding part 3 is composed of the adhesive layer 4, the Au layer 6, the diffusion preventing layer 7, and the bonding layer 8. The bonding part 3 may be in a shape of a block, or may be elongated into a shape of a band.

The adhesive layer 4 is a Cr thin film formed on the surface of the insulating layer 2 by sputtering. The Cr adhesive layer 4 is provided to ensure adhesiveness between the bonding part 3 and the insulating layer 2 to prevent the bonding part 3 from peeling off.

The diffusion preventing layer 7 formed on the Au layer 6 is formed of a material having low wettability with AuSn, that is, a material containing, as its main component, a platinum group metal such as Pt, Rh, Pd, Ir, Ru, or Os. The diffusion preventing layer 7 serves as a barrier layer to prevent an AuSn solder from diffusing into the Au layer 6.

The diffusion preventing layer 7 easily peels off due to its strong stress, so that when it is directly formed on the upper face of the adhesive layer 4, the diffusion preventing layer 7 could peel off. Therefore, in the bonding part 3, by sandwiching the Au layer 6 which is soft and relatively thick, between the adhesive layer 4 and the diffusion preventing layer 7, the stress of the diffusion preventing layer 7 is relieved and the diffusion preventing layer 7 is adhered thereto. In addition, by providing the Au layer 6 having small electric resistance, the bonding part 3 can be used as a wiring.

The bonding layer 8 is formed as an Au-plated film to provide eutectic bonding with the AuSn solder. In addition, the bonding layer 8 is formed so as to stay back of an edge of the diffusion preventing layer 7. That is, in the case where the bonding part 3 is in the shape of the block, an entire periphery of the bonding layer 8 stays back of an outer periphery side of the diffusion preventing layer 7. In addition, in the case where the bonding part 3 is in the shape of the band, both edges of the bonding layer 8 in a width direction stay back of both edges of the diffusion preventing layer 7.

As shown in FIG. 1A, a second bonding part, that is, a bonding part 13 is provided on a lower face of a second wafer, that is, a wafer 11. The wafer 11 is a Si wafer, and an insulating layer 12 of $SiO_2$ or SiN is formed on the lower face. In addition, a conductive layer which is high in chemical resistance (especially, remain unaltered by an acid), that is, a first conductive layer 14 is formed on a lower face of the insulating layer 2, a conductive layer formed of a material which can easily become thick, that is, a second conductive layer 15 is formed on a lower face of the first conducive layer 14, and a barrier layer 16 is formed on a lower face of the second conductive layer 15. Thus, the bonding part 13 is composed of the first conductive layer 14, the second conductive layer 15, and the barrier layer 16. The bonding part 13 also may be in a shape of a block or may be elongated into a shape of a band.

The first conductive layer 14 is formed of a conductive material having high chemical resistance. The first conductive layer 14 is formed of Ti, TiN, W, or a platinum group material. According to one or more embodiments of the present invention, Ti which has high resistance to copper sulfate serving as a plating solution and high adhesiveness with the insulating layer 12 is used for the first conductive layer 14, and its thickness is 500 to 1000 Å. The second conductive layer 15 is formed of a material which can be relatively large in thickness and convenient in forming a control circuit or a wiring. The second conductive layer 15 only has to be able to be formed thickly by a film forming method such as plating, sputtering, or CVD. For example, it is formed of Al, Cu, Ni, W, or polysilicon to be 2 μm in thickness. According to one or more embodiments of the present invention, the Al is used because it is inexpensive, versatile, and high in productivity. Meanwhile, in a case where a high-frequency signal is transmitted to the bonding part 13, according to one or more embodiments of the present invention, Ni, which is a magnetic material is not used. According to one or more embodiments of the present invention, when the Al is used, 5% by weight of Cu is added to prevent Al spike. The barrier layer 16 prevents Au from diffusing to the second conducive layer 15, prevents the material (Al) of the second conductive layer 15 from diffusing to Au of a Ti/Au layer 18, and prevents the wiring material and the bonding material from being mixed. The barrier layer 16 is formed of TiN having high barrier properties to be 400 Å in thickness.

An outer periphery face and an outer periphery part of a lower face of the bonding part 13 is covered with an insulating coating film 17 composed of SiO$_2$ or SiN, and a part of the lower face of the bonding part 13 (barrier layer 16) is not covered with the insulating coating film 17. Here, an opening width of the insulating coating film 17 is smaller than a width of the barrier layer 16. In addition, the Ti/Au layer 18 composed of a lower layer Ti and an upper layer Au is formed on the lower face of the bonding part 13 so as to be larger in area than an opening of the insulating coating film 17. A width of the Ti/Au layer 18 is larger than the opening width of the insulating coating film 17 but smaller than the width of the barrier layer 16. An AuSn solder layer 19 is formed on a lower face of the Ti/Au layer 18 in such a manner that an Sn layer 20 and an Au layer 21 are alternately stacked. In addition, the AuSn solder layer 19 may be formed of an AuSn alloy.

As shown in FIG. 1A, the wafer 1 having the bonding part 3 on its upper face and the wafer 11 having the bonding part 13 on its lower face are opposed to each other, and the AuSn solder layer 19 provided on the lower face of the bonding part 13 is stacked on an upper face of the bonding part 3. In this state, the wafer 11 is pressed against the wafer 1 at an appropriate pressure under the condition that the AuSn solder layer 19 is melted. As a result, as shown in FIG. 1B, the Au layer of the Ti/Au layer 18 and the bonding layer 8 (Au layer) are melted together with the AuSn solder layer 19 and become an AuSn solder 22, and the bonding part 13 and the bonding part 3 are bonded by the eutectic bonding.

Since the bonding layer 8 stays back of the edge of the diffusion preventing layer 7, and the diffusion preventing layer 7 containing the platinum group metal as its main component is low in wettability with AuSn, the molten AuSn solder 22 does not spread to the edge of the diffusion preventing layer 7. Therefore, the AuSn solder 22 does not flow to a side face of the bonding part 3 and not reach the adhesive layer 4, so that the AuSn does not diffuse into the adhesive layer 4. Thus, the adhesiveness of the adhesive layer 4 is not damaged because the AuSn does not diffuse into the adhesive layer 4.

In addition, since the outer periphery part of the lower face of the barrier layer 16 is covered with the insulating coating film 17 and the exposed area of the barrier layer 16 is reduced, the AuSn solder 22 is also not likely to spread in the bonding part 13.

In addition, when the film thickness of the second conductive layer 15 is large, the space between the wafers 1 and 11 can be large.

Figure 2A:
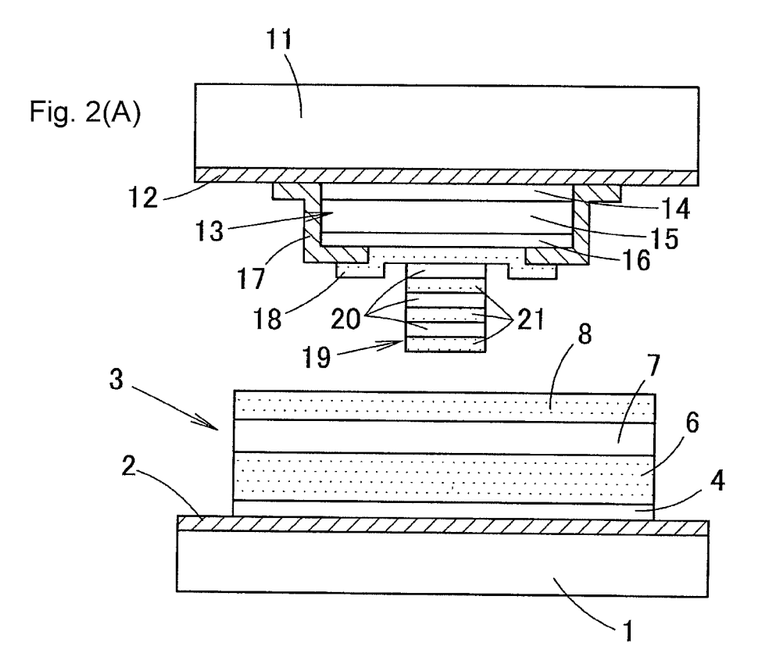
FIGS. 2A and 2B are schematic cross-sectional views to describe a method for bonding wafers according to a comparison example.
Figure 2B:
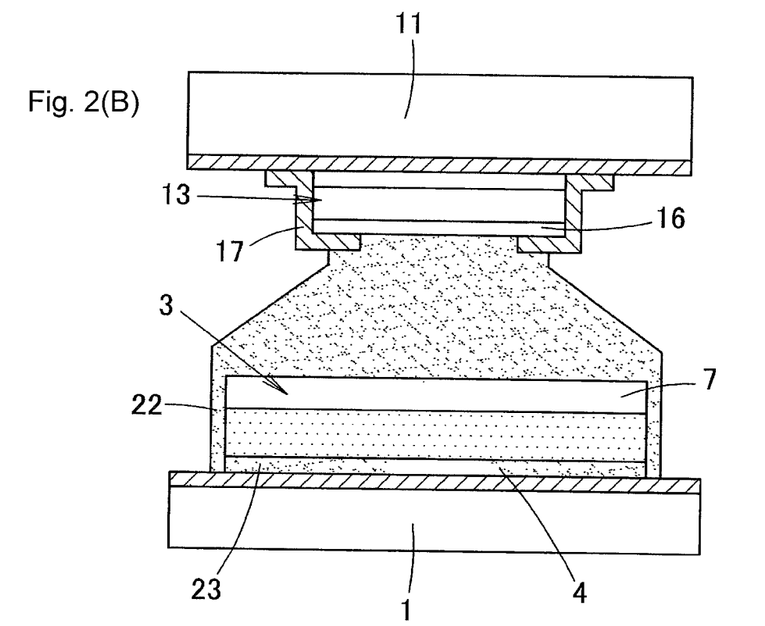

Comparison Between One or More Embodiments of the Present Invention and Comparison Example Next, a description will be given of a case where the bonding parts 3 and 13 are bonded by AuSn eutectic bonding by a method for bonding wafers in a comparison example. FIG. 2A shows a structure before a first wafer and a second wafer are bonded in the comparison example, and FIG. 2B shows a defect after the wafers have been bonded in the comparison example.

A difference between one or more embodiments of the present invention and the comparison example is in that while the width of the bonding layer 8 is made shorter than that of the diffusion preventing layer 7 in the bonding part 3, and the bonding layer 8 stays back of the edge of the diffusion preventing layer 7 in one or more embodiments of the present invention as shown in FIG. 1A, the bonding layer 8 and the diffusion preventing layer 7 are the same in width and the edge of the bonding layer 8 coincides with the edge of the diffusion preventing layer 7 in the comparison example as shown in FIG. 2A.

According to the comparison example 2, the bonding layer 8 covers the whole diffusion preventing layer 7, so that when the AuSn solder layer 19 is melted, the molten AuSn solder 22 could spread to the end of the diffusion preventing layer 7 and drop along the side face of the bonding part 3 beyond the end of the diffusion preventing layer 7. Thus, when the molten AuSn solder 22 comes into contact with the adhesive layer 4, the AuSn diffuses into the adhesive layer 4, which hinders the adhesiveness between the adhesive layer 4 and the wafer 1. As a result, according to the comparison example, there is a reduction in yield of a bonded product of the wafers.

On the other hand, according to one or more embodiments of the present invention, since the diffusion preventing layer 7 which is not covered with the bonding layer 8 is low in wettability with AuSn, the AuSn solder 22 does not spread to the end of diffusion preventing layer 7, and the AuSn is not likely to diffuse into the adhesive layer 4.

Figure 3A:
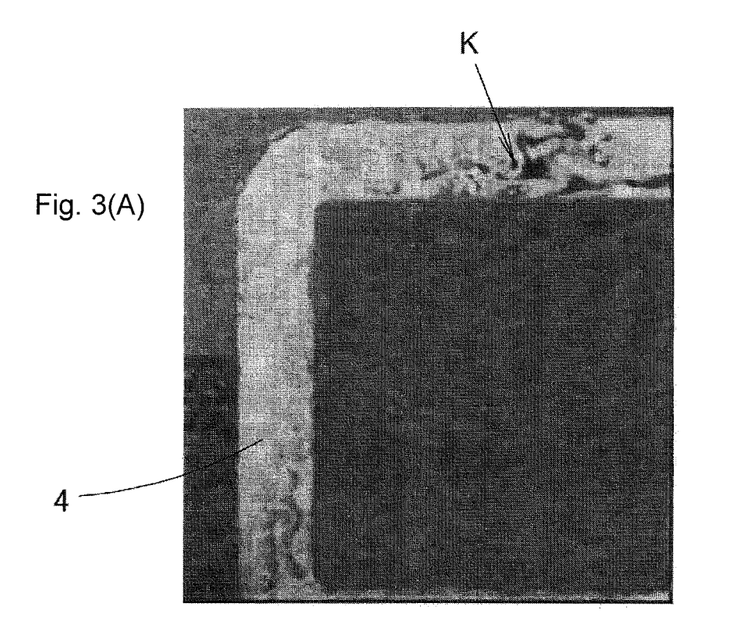
FIG. 3A is an infrared photograph showing a state of an adhesive layer after the wafers have been bonded in the comparison example.
Figure 3B:
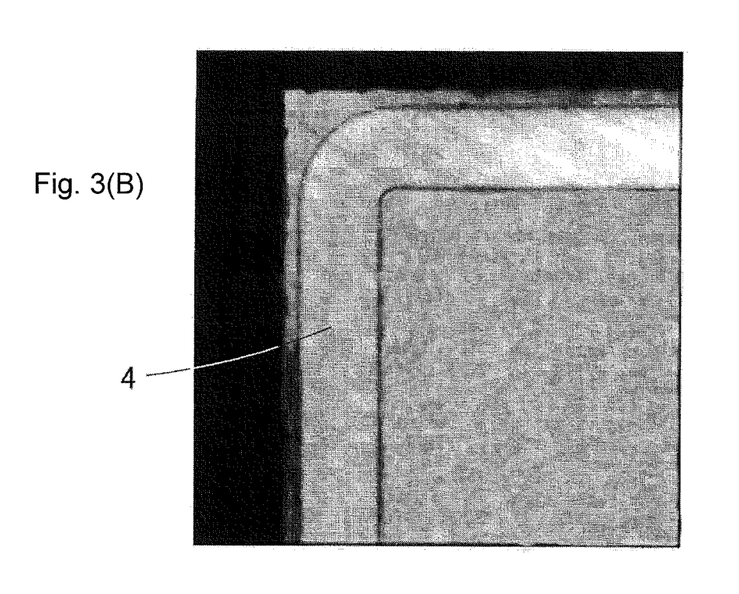
FIG. 3B is an infrared photograph showing a state of an adhesive layer after the wafers have been bonded in one or more embodiments of the present invention.

FIG. 3A is an infrared photograph showing a state of the adhesive layer 4 in the case where the wafers are bonded by AuSn bonding by the method in the comparison example. FIG. 3B is an infrared photograph showing a state of the adhesive layer 4 in the case where the wafers are bonded by the AuSn bonding by the method in one or more embodiments of the present invention. FIG. 3A and FIG. 3B each shows a boundary between the adhesive layer 4 and the insulating layer 2 taken from a lower face side.

As shown in FIG. 3A in the comparison example, the AuSn diffuses into the adhesive layer 4, so that the adhesive layer 4 considerably deteriorates. Especially, a part shown by K severely deteriorates due to the diffusion. Meanwhile, as shown in FIG. 3B in one or more embodiments of the present invention, the adhesive layer 4 keeps a clean and smooth state.

Case where Via Hole and Penetration Wiring are Provided

The bonding structure shown in FIG. 1B is good enough for a part in which the AuSn eutectic bonding is provided only between the bonding parts of the wafers (such as a bonding part for sealing outer periphery parts of the wafers in an electrostatic relay which will be described later). However, there is a case where a semiconductor integrated circuit is formed on the lower face of the wafer 11 (second wafer) and the semiconductor integrated circuit is connected to the bonding part 13. In this case, it is necessary to form a via hole in the wafer 11, and connect the bonding part 13 to a bump provided on an upper face of the wafer 11 through a penetration wiring provided in the via hole. In addition, there is a case where an actuator is provided on the wafer 1 (first wafer), and an electrode of the actuator is electrically connected to the bonding part 13 through the conductive bonding part 3. In this case also, it is necessary to form the via hole in the wafer 11, and connect the bonding part 13 to the bump provided on the upper face of the wafer 11 through the penetration wiring provided in the via hole.

Thus, in the case where the via hole and the penetration wiring have to be provided in the wafer, after the wafers 1 and 11 have been bonded, the wafer 11 is to be processed as shown in FIGS. 4A to 6B.

FIGS. 4A to 6B show steps of providing a via hole 32 and a penetration wiring 33 in the wafer 11 after the wafers 1 and 11 have been bonded according to one or more embodiments of the present invention. Hereinafter, these steps will be described with reference to FIGS. 4A to 6B.

Figure 4A:
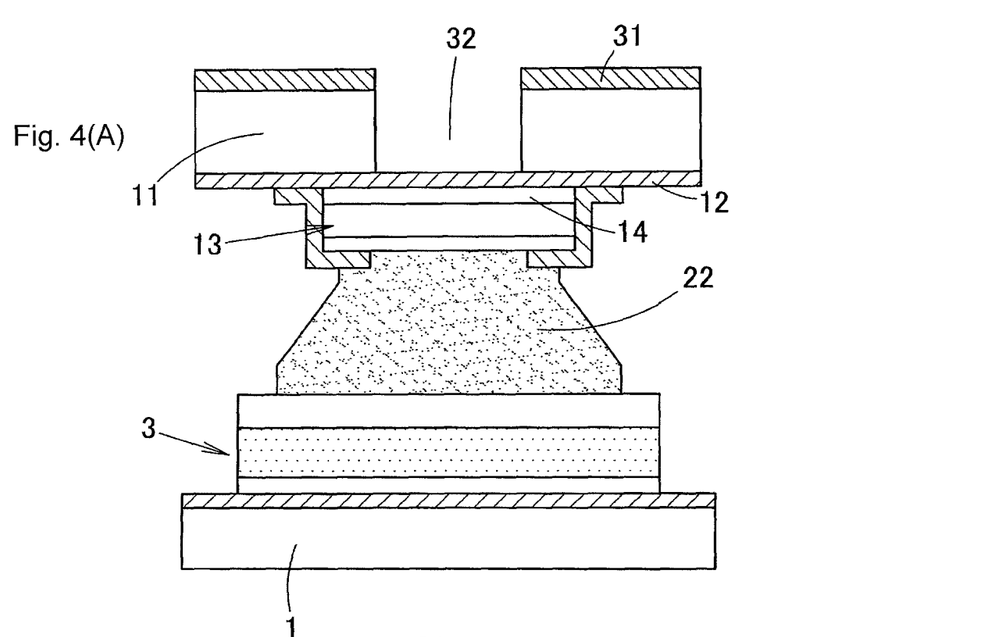
FIGS. 4A and 4B are schematic cross-sectional views to describe steps of forming a penetration wiring in a second wafer after the wafers have been bonded to each other.

First, as shown in FIG. 4A, an insulating layer 31 is formed of SiO$_2$ or SiN on the upper face of the wafer 11, and the via hole 32 is formed in the wafer 11 just above the bonding part 13, so that the insulating layer 12 is exposed to a bottom face of the via hole 32.

Figure 4B:
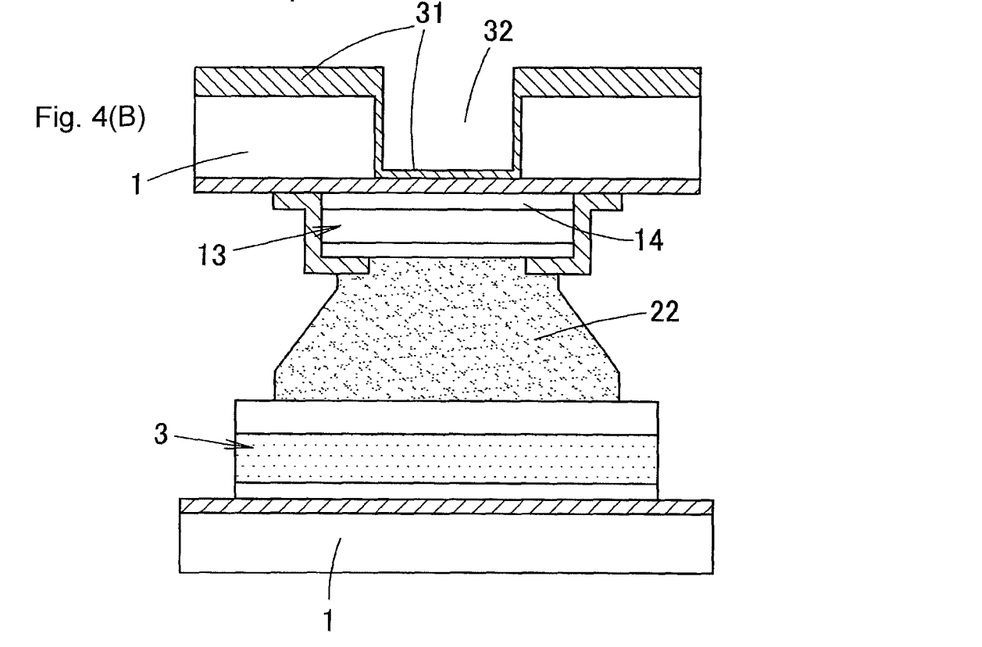

Then, as shown in FIG. 4B, by evaporating $SiO_2$ or SiN on a whole surface of the wafer 11, the insulating layer 31 is formed on an inner face of the via hole 32, and the insulating layer 31 on the upper surface of the wafer 11 is thickened.

Figure 5A:
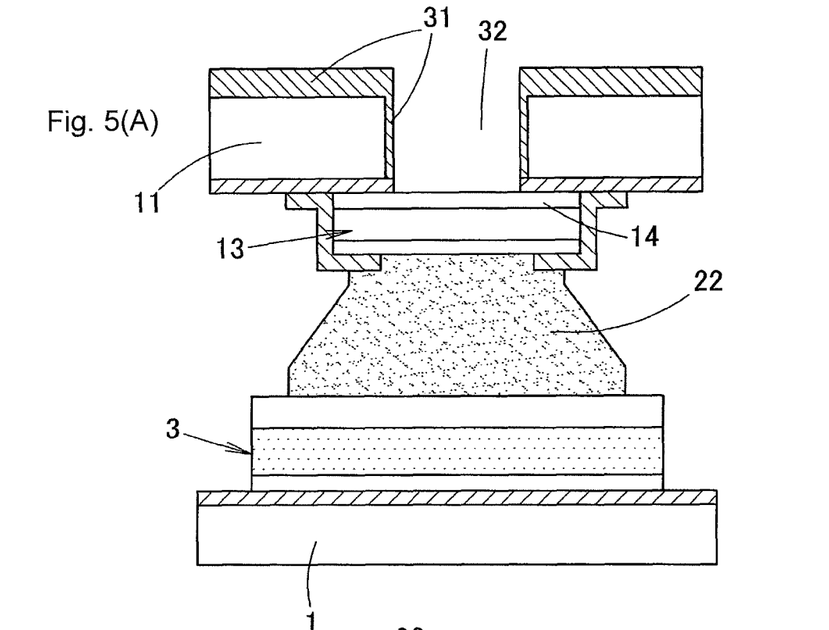
FIGS. 5A and 5B are schematic cross-sectional views to describe steps of forming the penetration wiring in the second wafer after the wafers have been bonded to each other, after the step shown in FIG. 4B.

Then, as shown in FIG. 5A, the insulating layer 31 and the insulating layer 12 on the bottom face of the via hole 32 are removed by etching, and the first conductive layer 14 is exposed to the bottom face of the via hole 32.

Figure 5B:
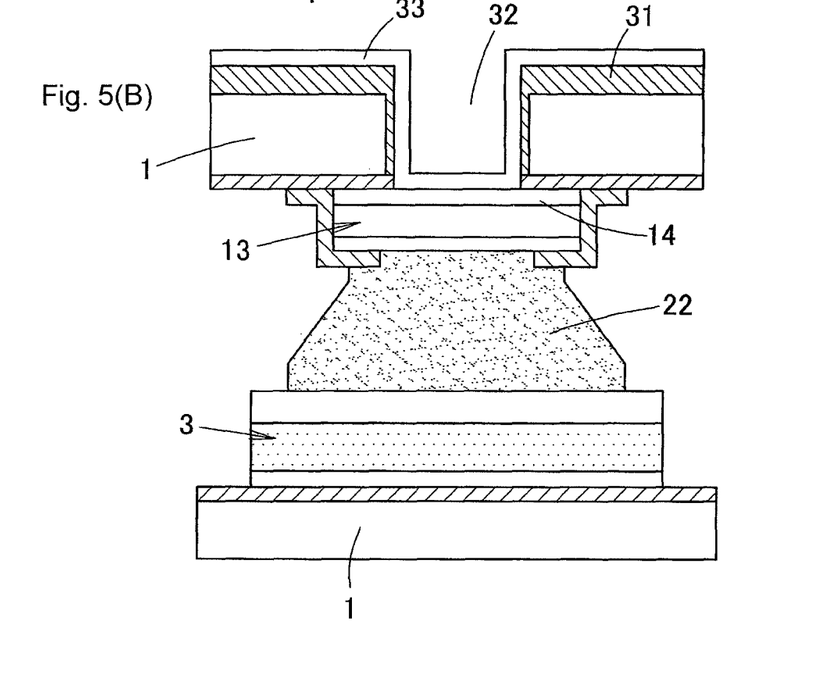
Figure 6A:
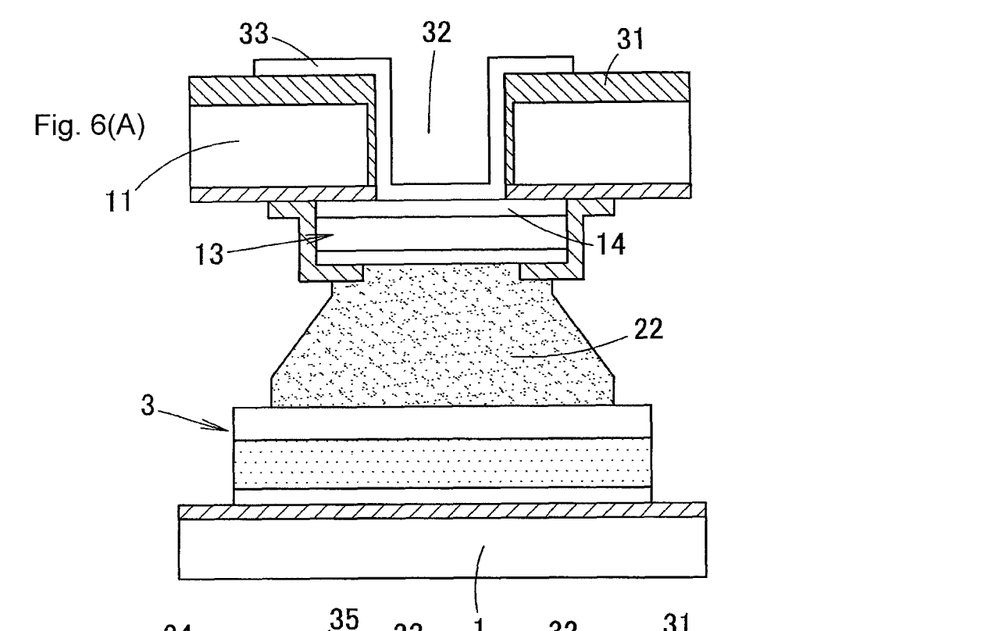
FIGS. 6A and 6B are schematic cross-sectional views to describe steps of forming the penetration wiring in the second wafer after the wafers have been bonded to each other, after the step shown in FIG. 5B.

Then, as shown in FIG. 5B, the penetration wiring 33 is formed by plating a conductive material such as Cu or Al on a surface ranging from the bottom face and the inner peripheral face of the via hole 32 to an upper face of the insulating layer 31, and then as shown in FIG. 6A, the penetration wiring 33 is formed into a predetermined pattern by etching. The first conductive layer 14 is formed of Ti, TiN, or W which is high in chemical resistance, so that when the via hole 32 is formed, and the penetration wiring 33 is formed by plating, an etching solution and a plating solution are stopped by the first conductive layer 14, and the bonding part 13 is protected from the etching solution and the plating solution.

Figure 6B:
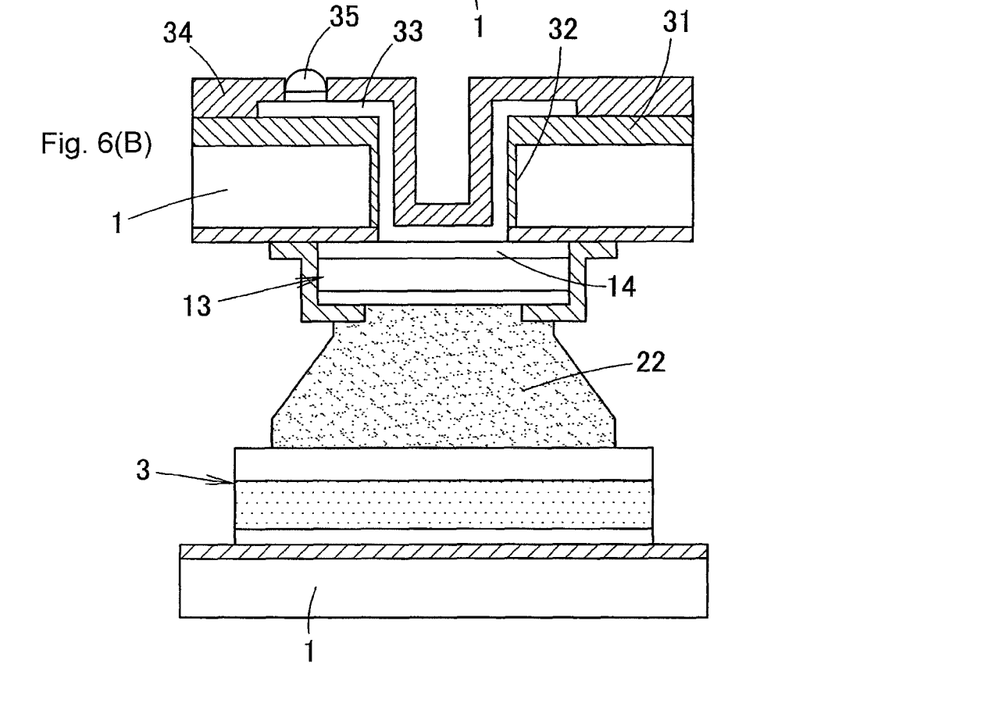

Then, as shown in FIG. 6B, the upper face of the wafer 11 is covered with a protective film 34 formed of polyimide, the protective film 34 is partially opened to expose the penetration wiring 33, and a bump 35 is formed on the exposed part of the penetration wiring 33.

Case of Electrostatic Relay

Figure 7:
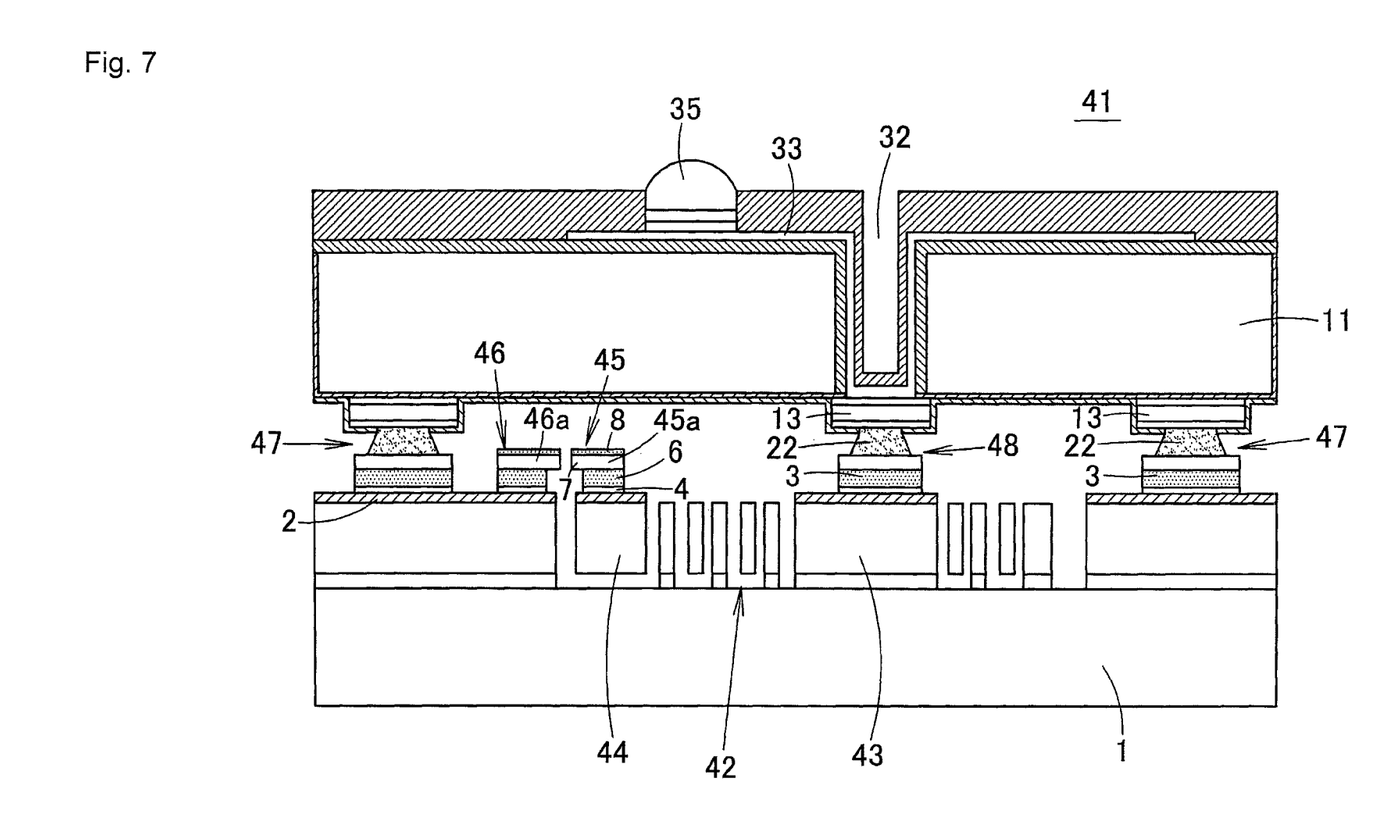
FIG. 7 is a schematic cross-sectional view of an electrostatic relay produced by the method for bonding the wafers according to the present invention.

An electrostatic relay 41 (electronic component) will be described as a specific example of a bonded body of the wafers. FIG. 7 is a schematic cross-sectional view of the electrostatic relay.

The electrostatic relay 41 has been produced on the wafer 1 by MEMS technique. The electrostatic relay 41 is composed of a fixed contact part 46 and a movable contact part 45 (each serves as an opening/closing contact point) arranged so as to be opposed to each other, and an electrostatic actuator 42 which translates the movable contact part 45 by electrostatic force. The electrostatic actuator 42 is composed of a fixed part 43 and a movable part 44 produced in one part of the wafer 1. The fixed part 43 has a comb-like teeth structure in plural rows, and formed integrally with the wafer 1. The movable part 44 also has a comb-like teeth structure in plural rows, and is supported in a state separated from the wafer 1 so that it can be horizontally moved back and forth. The comb-like teeth structure of the fixed part 43 and the comb-like teeth structure of the movable part 44 engage with each other so as not to come in contact. Thus, when a voltage is applied between the comb-like teeth structures, the movable part 44 is pulled toward the fixed part 43 and the movable part 44 is horizontally moved by the electrostatic force generated between the comb-like teeth structure of the fixed part 43 and the comb-like teeth structure of the movable part 44.

A bonding part 47 is positioned in each of outer periphery edges of the wafers 1 and 11, and seals a space between the wafers 1 and the wafer 11. The bonding part 47 is provided by bonding the bonding part 3 and the bonding part 13 with the AuSn solder 22 by the eutectic bonding.

A bonding part 48 is a part to electrically connect the electrostatic actuator 42 to the penetration wiring 33 and the bump 35. This bonding part 48 is also provided by bonding the bonding part 3 and the bonding part 13 with the AuSn solder 22 by the eutectic bonding.

The movable contact part 45 is provided on an upper face of the movable part 44 of the electrostatic actuator 42. The fixed contact part 46 is provided on the upper face of the wafer 1 so as to be opposed to the movable contact part 45. The movable contact part 45 and the fixed contact part 46 are not the bonding parts, but they are formed at the same time as the bonding part 3, and have the same layer structure as the bonding part 3. That is, each of the movable contact part 45 and the fixed contact part 46 is composed by sequentially stacking the adhesive layer 4, the Au layer 6, the diffusion preventing layer 7, and the bonding layer 8, and each layer has the same thickness and height from the surface of the wafer 1 as the corresponding layer in the bonding part 3. Thus, a layer containing the platinum group metal as its main component (corresponding to the diffusion preventing layer 7) serves as a fixed contact point 45a and a movable contact point 46a. In addition, a layer formed of Au (corresponding to the Au layer 6) is a wiring part which runs parallel to the upper face of the wafer 1 and is connected to the fixed contact point 45a or the movable contact point 46a.

In addition, by increasing the thickness of the second conductive layer 15 formed of Al in the bonding part 13, a height of the space between the wafers 1 and 11 can increase, so that the movable contact part 45 can be prevented from interfering with the wafer 11 when the movable contact part 45 horizontally moves.

In addition, since the width of the bonding layer 8 is smaller than the width of the diffusion preventing layer 7, and the AuSn solder is not likely to flow to the lower part of the bonding part 3, the movable part 44 is prevented from getting stuck because the AuSn solder does not flow to the movable section 44.

In addition, a process circuit to process a detection signal outputted from the electrostatic relay 41 is provided on the lower face of the wafer 11, but it is not shown in FIG. 7.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS

1 Wafer (First Wafer)
3 Bonding Part (First Bonding Part)
4 Adhesive Layer
6 Au Layer
7 Diffusion Preventing Layer
8 Bonding Layer
11 Wafer (Second Wafer)
13 Bonding Part (Second Bonding Part)
14 First Conductive Layer
15 Second Conductive Layer
16 Barrier Layer
17 Insulating Coating Film
18 Ti/Au Layer
19 AuSn Solder Layer
20 Sn Layer
21 Au Layer
22 AuSn Solder
31 Insulating Layer
32 Via Hole
33 Penetration Wiring
34 Protective Layer
35 Bump

What is claimed is:

1. A method for bonding wafers, comprising:
   forming a first bonding part on a surface of a first wafer by stacking a diffusion preventing layer formed of a material having low wettability with AuSn above the first wafer and forming a bonding layer on a surface of the diffusion preventing layer such that the bonding layer stays back of an edge of the diffusion preventing layer;
   forming a second bonding part on a surface of a second wafer; and
   bonding the first bonding part and the second bonding part by eutectic bonding with an AuSn solder under a condition that the first wafer and the second wafer are opposed to each other.

2. The method for bonding the wafers according to claim 1, wherein the diffusion preventing layer of the first bonding part is formed of a material containing, as a main component thereof, a platinum group metal.

3. The method for bonding the wafers according to claim 1, wherein the bonding layer of the first bonding part is formed of a material containing Au as a main component thereof.

4. The method for bonding the wafers according to claim 1, further comprising:
   an adhesive layer containing Cr as a main component thereof is formed on the surface of the first wafer.

5. The method for bonding the wafers according to claim 4, further comprising:
   an Au layer is formed between the adhesive layer and the diffusion preventing layer.

6. The method for bonding the wafers according to claim 1, further comprising:
   an AuSn solder layer is previously formed on at least one surface of the first bonding part and the second bonding part by alternately stacking Au and Sn or with an AuSn alloy, and
   the first bonding part and the second bonding part are bonded by AuSn eutectic bonding with the molten AuSn solder layer.

7. The method for bonding the wafers according to claim 1, wherein in the step of forming the first bonding part on the surface of the first wafer, an opening/closing contact point is formed by stacking layers formed of the same materials in the same order as those of the first bonding part, on the surface of the first wafer.

8. The method for bonding the wafers according to claim 7, wherein each layer of the opening/closing contact point has the same thickness and the same height from the surface of the first wafer as those of the corresponding layer in the first bonding part.

9. The method for bonding the wafers according to claim 1, further comprising:
   a face having contact with the second wafer in the second bonding part, comprising a conductive layer formed of a material having high chemical resistance,
   a via hole formed in the second wafer in a position corresponding to the second bonding part, and
   a penetration wiring formed in the via hole to be connected to the conductive layer formed of the material having the high chemical resistance.

10. The method for bonding the wafers according to claim 1, wherein the second bonding part has a conductive layer having a relatively large thickness.

11. The method for bonding the wafers according to claim 1,
    wherein a surface of the second bonding part comprises an Au layer, and
    wherein an outer periphery face and an outer periphery edge of the surface of the second bonding part are covered with an insulating coating film.

12. The method for bonding the wafers according to claim 9, wherein the material having the high chemical resistance is one or more materials selected from Ti, TiN, W, and platinum group material.

13. The method for bonding the wafers according to claim 10, wherein the conductive layer having the relatively large thickness is formed of one or more materials selected from Al, Cu, Ni, W, and polysilicon.

* * * * *